US009255961B2

(12) United States Patent
Sato et al.

(10) Patent No.: US 9,255,961 B2
(45) Date of Patent: *Feb. 9, 2016

(54) SEMICONDUCTOR INTEGRATED CIRCUIT, OPERATING METHOD OF SEMICONDUCTOR INTEGRATED CIRCUIT, AND DEBUG SYSTEM

(71) Applicant: Spansion LLC, Sunnyvale, CA (US)

(72) Inventors: Takashi Sato, Yokohama (JP); Toshiaki Saruwatari, Yokohama (JP); Ken Ryu, Yokohama (JP)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/080,844

(22) Filed: Nov. 15, 2013

(65) Prior Publication Data

US 2014/0070840 A1    Mar. 13, 2014

Related U.S. Application Data

(63) Continuation of application No. 13/014,318, filed on Jan. 26, 2011, now Pat. No. 8,595,562.

(30) Foreign Application Priority Data

Jun. 3, 2010    (JP) ................................ 2010-127653

(51) Int. Cl.
*G06F 11/00* (2006.01)
*G01R 31/28* (2006.01)
(Continued)

(52) U.S. Cl.
CPC ...... *G01R 31/28* (2013.01); *G06F 1/26* (2013.01); *G06F 11/24* (2013.01); *G06F 11/3024* (2013.01); *G06F 11/3062* (2013.01); *G06F 11/3636* (2013.01); *G06F 11/3648* (2013.01)

(58) Field of Classification Search
CPC ...................................................... G06F 11/348
USPC ................... 714/45, 46, 47.1, 724, 733, 734
See application file for complete search history.

(56) References Cited

U.S. PATENT DOCUMENTS 5,786,689 A * 7/1998 Kimura .................... 324/762.07
6,687,757 B1    2/2004 Ben-Ze'ev et al.
(Continued)

FOREIGN PATENT DOCUMENTS

JP         7-44416 A    2/1995
JP    2007044416 A    2/1995
(Continued)

OTHER PUBLICATIONS

English translation of Japanese Official Action for Application No. 2010-127653, dated Feb. 10, 2014, 4 pages.
(Continued)

*Primary Examiner* — Dieu-Minh Le

(57) ABSTRACT

A current measurement unit measuring power supply currents each consumed in a plurality of circuit blocks of which at least one of the circuit blocks includes a processor, and outputting the measurement result as the power supply current values. A selection unit selecting at least one of the power supply current values according to selection information. A trace buffer sequentially holding the power supply current values being selected by the selection unit together with execution information of the processor, and sequentially outputting the held information. By selecting the power supply current values of the circuit blocks required for debugging according to the selection information, the number of external terminals of a semiconductor integrated circuit required for the debugging which includes tracing the power supply current values may be reduced. As a result, a chip size of the semiconductor integrated circuit with a debug function may be reduced.

21 Claims, 5 Drawing Sheets

(51) Int. Cl.
    *G06F 1/26*     (2006.01)
    *G06F 11/24*     (2006.01)
    *G06F 11/30*     (2006.01)
    *G06F 11/36*     (2006.01)

(56) References Cited

U.S. PATENT DOCUMENTS

| | | | |
|---|---|---|---|
| 6,883,106 B2 | 4/2005 | Mullins et al. | |
| 6,975,524 B2 | 12/2005 | Montorsi et al. | |
| 6,978,409 B2 * | 12/2005 | Matsubara et al. | 714/724 |
| 2011/0302456 A1 | 12/2011 | Sato et al. | |

FOREIGN PATENT DOCUMENTS

| | | |
|---|---|---|
| JP | 08-315598 | 11/1996 |
| JP | 2001-222561 A | 8/2001 |
| JP | 2001222561 A | 8/2001 |
| JP | 2004-348568 A | 12/2004 |
| JP | 2004348568 A | 12/2004 |
| JP | 2006-209476 | 8/2006 |
| JP | 2008060444 A | 3/2008 |

OTHER PUBLICATIONS

Japanese Official Action for Application No. 2010-127653, dated Feb. 10, 2014, 3 pages.
English-language abstract for: Kazuhiko, JP 2006-209476.
English-language abstract for: Nobufumi et al., JP 08-315598.
SIPO Office Action for Application No. 2014-191979 dated Sep. 15, 2015; 3 pages.
USPTO Non-Final Rejection for U.S. Appl. No. 13/014,318 dated Mar. 25, 2013; 17 pages.
USPTO Notice of Allowance for U.S. Appl. No. 13/014,318 dated Aug. 7, 2013; 6 pages.

* cited by examiner

SEMICONDUCTOR INTEGRATED CIRCUIT, OPERATING METHOD OF SEMICONDUCTOR INTEGRATED CIRCUIT, AND DEBUG SYSTEM

CROSS REFERENCE TO RELATED APPLICATIONS

This application is a continuation of co-pending U.S. patent application Ser. No. 13/014,318, which is based upon and claims the benefit of priority from Japanese Patent Application No. 2010-127653, filed on Jun. 3, 2010, the entire contents of which are incorporated herein by reference.

BACKGROUND OF THE INVENTION

1. Field of the Invention

The present embodiments relate to a semiconductor integrated circuit with a trace function for debugging a user system including a plurality of circuit blocks, a method of operating the semiconductor integrated circuit, and a debugging system.

2. Background Art

For example, in a debugging system which debugs a user system including a processor, such as a CPU (Central Processing Unit), and a peripheral circuit, it has been proposed to monitor the current consumption of the processor or peripheral circuit or monitor a current flowing into an external terminal of the processor. Related arts are discussed in Japanese Laid-open Patent Publication No. 2001-222561, No. 2004-348568, and No. 07-44416.

When a plurality of the current consumptions of the currents flowing into the processor, the peripheral circuit, and the like is measured, the data amount indicative of the current values obtained by this measurement increases and the number of bits required for transferring the current values to a trace buffer or the like increases. Thus, the number of external terminals for debugging increases and the product cost increases. In particular, in the semiconductor integrated circuit with a debug function, an increase in the number of external terminals increases the chip size and the system cost.

BRIEF SUMMARY OF THE INVENTION

According to an aspect of the embodiment, a semiconductor integrated circuit includes a current measurement unit measuring power supply currents each consumed in a plurality of circuit blocks of which at least one of the circuit blocks includes a processor, and outputting a result of the measurement as power supply current values; a selection unit selecting at least one of the power supply current values according to selection information; and a trace buffer sequentially holding the power supply current values being selected by the selection unit together with execution history information indicating an execution history of the processor as trace information, and sequentially outputting the trace information being held.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS/FIGURES

DESCRIPTION OF THE EMBODIMENTS

Figure 1:
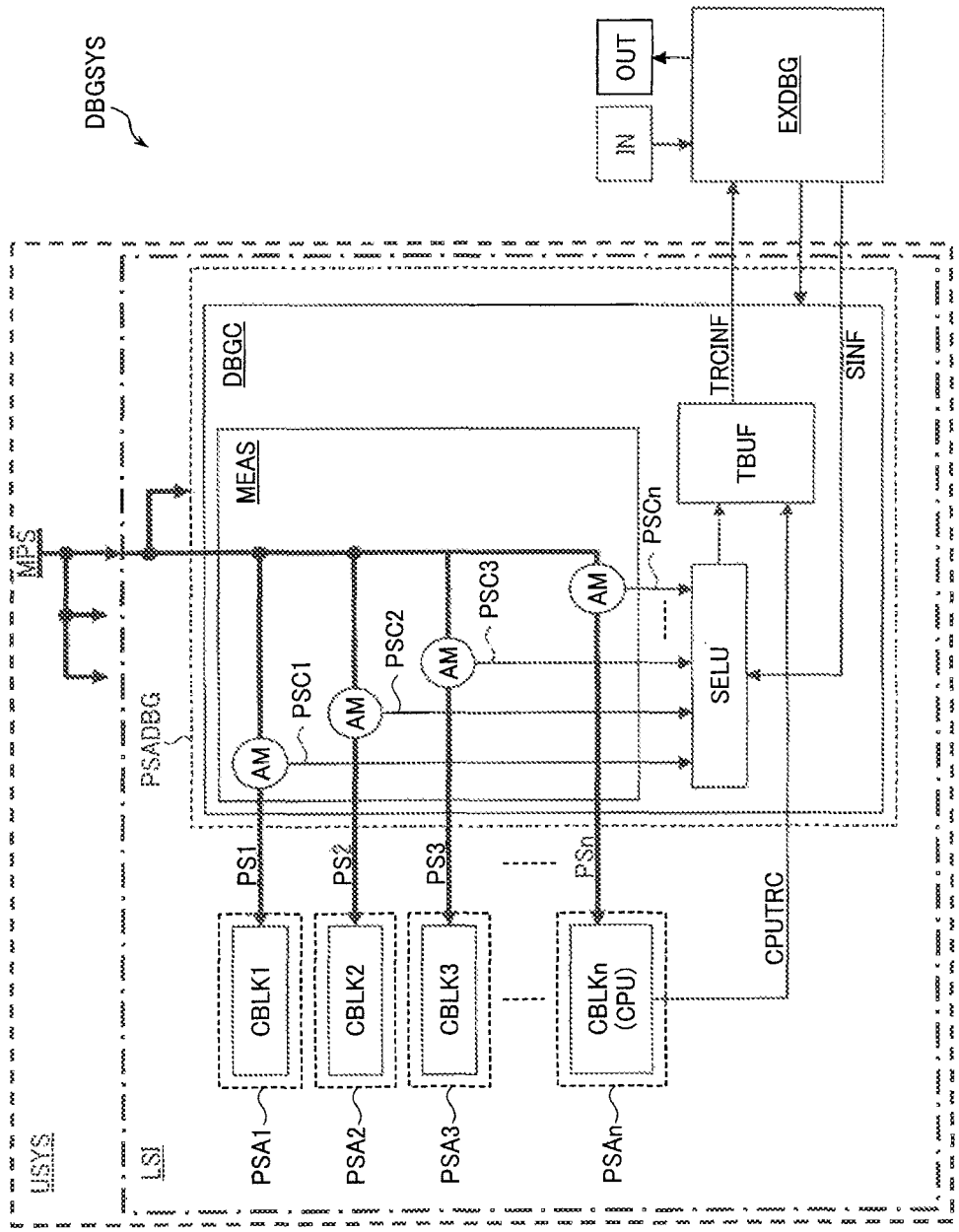
FIG. 1 illustrates an example of a debugging system in one embodiment.

Hereinafter, embodiments will be described with reference to the accompanying drawings. FIG. 1 illustrates an example of a debugging system DBGSYS in one embodiment. The debugging system DBGSYS includes a semiconductor integrated circuit LSI mounted in a user system USYS to be debugged, and an external debugging apparatus EXDBG. The semiconductor integrated circuit LSI includes a plurality of circuit blocks CBLK (CBLK1, CBLK2, CBLK3, . . . , CBLKn) which are user circuits to be debugged, and a debugging circuit DBGC for debugging the circuit blocks CBLK.

For example, the user system USYS is microcomputer application equipment, such as portable equipment, and includes the semiconductor integrated circuit LSI in a form of a chip coupled to a board, a plurality of other semiconductor chips, an input device, an output device, and the like. Note that the circuit blocks CBLK and the debugging circuit DBGC may be formed as individual semiconductor chips, respectively.

The user system USYS includes an external power supply terminal for supplying a main power supply voltage MPS to the semiconductor integrated circuit LSI and the other semiconductor chips on the user system USYS. In FIG. 1, a thick line indicates a power supply line. The main power supply voltage MPS is supplied to a power supply area PSADBG of the debugging circuit DBGC, and is furthermore supplied to each circuit block CBLK1-n as a power supply voltage PS (PS1, PS2, PS3, . . . , PSn) via a current measurement unit MEAS of the debugging circuit DBGC.

The circuit block CBLK is any one of a processor CPU (microcomputer), a peripheral circuit, a memory, and the like coupled to an internal bus. Here, the peripheral circuit includes an image processing macro, a memory for image data, an analog macro, an I/O macro, and the like. For example, the processor CPU operates by executing a program stored in a memory coupled to an internal memory or internal bus, and controls the whole operation of the user system USYS. Note that, in FIG. 1, the processor CPU is formed in the circuit block CBLKn, however, the processor CPU may be formed in the plurality of circuit blocks, respectively. Each circuit block CBLK1-n is formed in a power supply area PSA (PSA1, PSA2, PSA3, . . . , PSAn) to which the mutually-independent power supply voltages PS1-n are supplied, respectively.

The debugging circuit DBGC and external debugging apparatus EXDBG function as an emulator which debugs a program executed by the processor CPU while actually operating the user system USYS. The debugging circuit DBGC realizing a part of the emulator function is mounted in the semiconductor integrated circuit LSI including the processor CPU, so that debugging may be performed while the processor CPU actually executing a user program which realizes the user system USYS. That is, on-chip debugging may be performed.

The debugging circuit DBGC is enabled under control from the external debugging apparatus EXDBG via a debugging interface during development of the user system USYS.

Then, in a debug mode to debug the user system USYS, the debugging circuit DBGC operates to trace an operation state of the processor CPU and debug a program executed by the processor CPU.

The debugging circuit DBGC is formed in the power supply area PSADBG independent of the power supply areas PSA1-n. The debugging circuit DBGC includes a current measurement unit MEAS, a selection unit SELU, and a trace buffer TBUF. The current measurement unit MEAS includes ammeters AM coupled to power supply lines PS1-n, respectively. Each ammeter AM measures a power supply current flowing into the corresponding circuit block CBLIK1-n and outputs the measured power supply current value PSC (PSC1, PSC2, PSC3, PSCn) to the selection unit SELU. The power supply current value PSC1-n indicates the current consumption consumed by each circuit block CBLK1-n.

The selection unit SELU selects any one of the power supply current values PSC1-n according to selection information SINF and outputs it to the trace buffer TBUF. For example, the selection information SINF is generated by the external debugging apparatus EXDBG. Note that, the selection unit SELU may, in such a range that the number of bits of the trace information TRCINF does not exceed a design specification, select a plurality of power supply current values PSC and simultaneously output the selected values to the trace buffer TBUF.

By selectively supplying at least one power supply current value PSC to the trace buffer TBUF, a program executed by the processor CPU may be debugged efficiently. Specifically, an increase in the power supply current of a certain circuit block CBLK due to a failure of a program may be easily found. In other words, the detection of an abnormality of a power supply current may facilitate the detection of a failure of a program. Further, because the power supply current may be traced for each circuit block CBLK, a failure portion of the program may be easily identified.

The trace buffer TBUF sequentially holds the power supply current values PSC from the selection unit SELU together with execution history information CPUTRC of the processor CPU, and sequentially outputs the held values to the external debugging apparatus EXDBG as the trace information TRCINF. For example, the trace buffer TBUF is formed as a FIFO (First-In First-Out) memory. The execution history information CPUTRC includes at least any one of an instruction such as a branch instruction, access data, an access address, and the like.

The external debugging apparatus EXDBG controls the operation of the debugging circuit DBGC according to a debug program DBGPRG. The external debugging apparatus EXDBG has a function to set, according to an instruction input from an input device IN, a stop condition or trace condition of a program executed by the processor CPU, as with the commonly used ICE (In-Circuit Emulator). Moreover, the external debugging apparatus EXDBG has a function to output the trace information TRCINF to an output device OUT, such as a display or a printer. Note that a host computer including the input device IN and output device OUT may be coupled to the external debugging apparatus EXDBG.

The external debugging apparatus EXDBG sequentially holds the execution history information CPUTRC of the processor CPU and the power supply current values PSC supplied from the trace buffer TBUF, as the trace information TRCINF. Furthermore, the external debugging apparatus EXDBG generates selection information SINF according to an instruction input from the input device and outputs it to the debugging circuit DBGC. The selection information SINF may be generated for each execution cycle of the processor CPU in order to switch the power supply current value PSC to be selected. At this time, the power supply current values PSC1-n may be traced in a time division manner. By cyclically selecting the power supply current values PSC, the power supply current values PSC of all the circuit blocks CBLIK1-n may be traced while minimizing the number of bits of the trace information TRCINF.

In this embodiment, the debugging circuit DBGC monitors the execution state of the processor CPU from the execution information which the processor CPU outputs. The debugging circuit DBGC, upon detection of an operation to be traced while the processor CPU is executing a user program, temporarily stores the execution history information of the processor CPU and a power supply current value PSCi into the trace buffer TBUF. The debugging circuit DBGC sequentially outputs the trace data stored in the trace buffer TBUF to the external debugging apparatus EXDBG.

The external debugging apparatus EXDBG stores the trace information TRCINF output from the debugging circuit DBGC into an internal trace memory. Then, the external debugging apparatus EXDBG reads and analyzes the trace information TRCINF on the trace memory according to the debug program which the external debugging apparatus EXDBG itself executes, and outputs the power supply current value PSC together with the execution history of the processor CPU to the output device OUT.

As described above, in this embodiment, at least any one of the power supply current values PSC1-n of the circuit blocks CBLICI-n needed for debugging is selected and traced, so that the amount of information held together with the execution history information CPUTRC of the processor CPU may be minimized. Moreover, the number of bits of the trace information TRCINF output from the trace buffer TBUF may be minimized. Therefore, also when the power supply current values PSC1-n of the circuit blocks CBLK1-n are traced, the number of external terminals for debugging formed in the semiconductor integrated circuit LSI may be reduced. As a result, the chip size of the semiconductor integrated circuit LSI including the debugging circuit DBGC may be reduced and the cost may be reduced.

Figure 2:
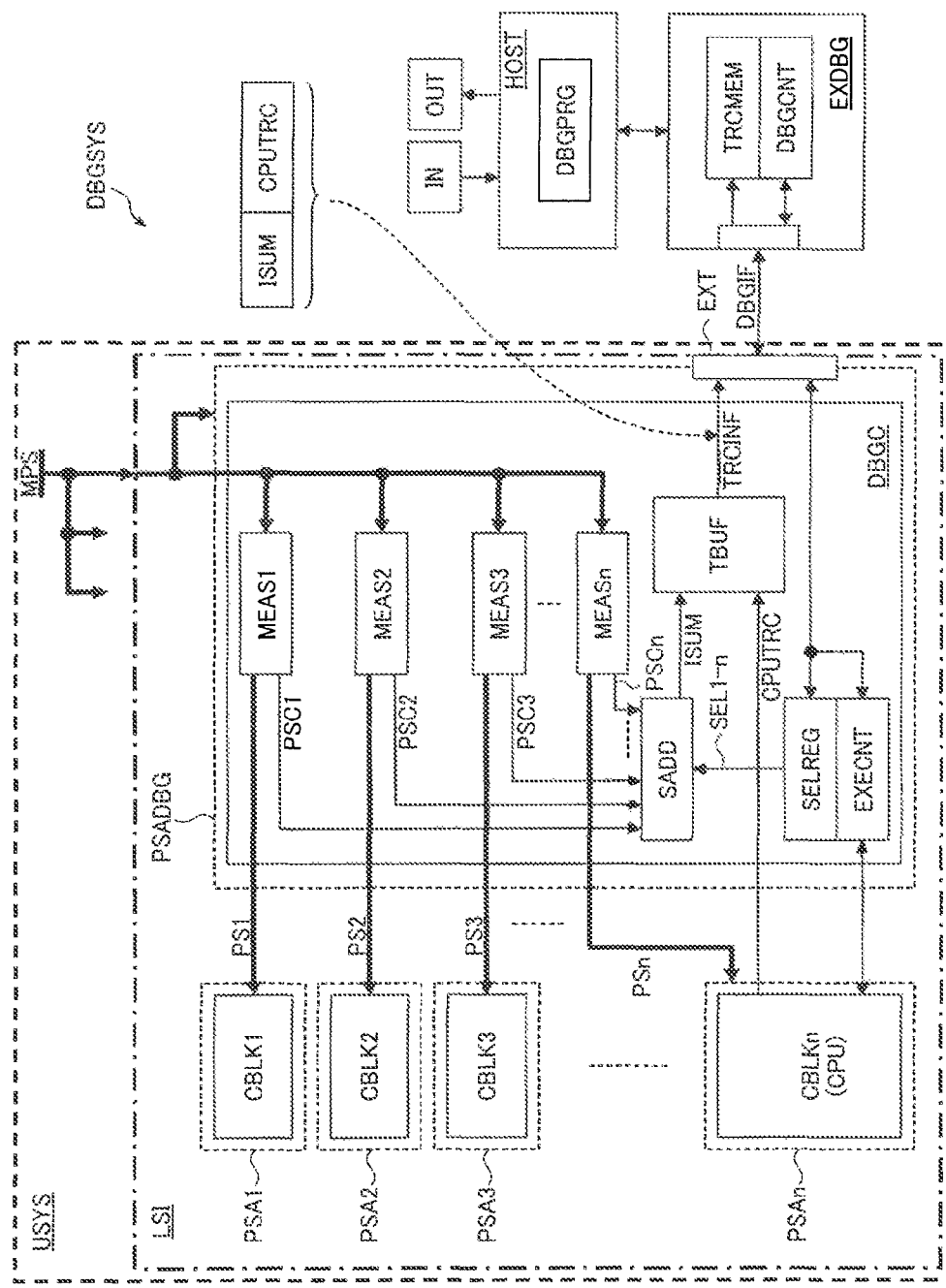
FIG. 2 illustrates an example of a debugging system in an alternative embodiment.

FIG. 2 illustrates an example of the debugging system DBGSYS in an alternative embodiment. For the same elements as those in the embodiment described above, the same reference symbols are given, and the detailed description thereof is omitted. In this embodiment, the debugging circuit DBGC differs from that of FIG. 1. Moreover, the debugging system DBGSYS includes a host computer HOST coupled to the external debugging apparatus EXDBG. The semiconductor integrated circuit LSI and user system USYS are the same as those in FIG. 1 except that the debugging circuit DBGC is different. That is, the circuit blocks CBLIK1-n is any one of the processor CPU (microcomputer) coupled to an internal bus, a peripheral circuit, such as an image processing macro, a memory for image data, an analog macro, or an I/O macro, and a memory in which a program executed by the processor CPU is stored. The debugging circuit DBGC, external debugging apparatus EXDBG, and host computer HOST function as an emulator debugging the program executed by the processor CPU.

The debugging circuit DBGC includes current measurement units MEAS (MEAS1, MEAS2, MEAS3, ..., MEASn), a selective adder unit SADD, a selection register SELREG, an execution control unit EXECNT, and the trace buffer TBUF. The current measurement units MEAS1-n include the ammeters AM illustrated in FIG. 1, respectively, and have the same function as the current measurement unit MEAS illustrated in FIG. 1.

The selective adder unit SADD receives the power supply current values PSC1-n from the respective current measurement units MEAS1-n. The selective adder unit SADD selects at least one of the power supply current values PSC1-n according to selection information SEL (SEL1, SEL2, SEL3, . . . , SELn) from the selection register SELREG. Then, the selective adder unit SADD adds the selected power supply current value PSC, and outputs the addition result to the trace buffer TBUF as a power supply current value ISUM.

The selection register SELREG is set according to the write from the external debugging apparatus EXDBG, and holds the selection information SEL1-n. The execution control unit EXECNT, under control from the external debugging apparatus EXDBG, outputs, for example, a signal for controlling the execution of the processor CPU to the processor CPU, and reads information held in a register or memory included in the processor CPU. Here, the signal for controlling the execution of the processor CPU includes a control signal for reading/writing data from/into the register in the processor CPU, a control signal for temporarily holding a data signal and the operation of the processor CPU, and the like.

The trace buffer TBUF is the same as that illustrated in FIG. 1 except that the former holds the power supply current value ISUM (a summation of the selected power supply current values PSC) in place of the power supply current value PSC. The trace buffer TBUF sequentially outputs the held power supply current value ISUM and execution history information CPUTRC to the external debugging apparatus EXDBG via the debugging interface DBGIF as the trace information TRCINF. Although not limited in particular, the power supply current value ISUM is stored in the trace buffer TBUF for each instruction executed by the processor CPU, in other words, the selective adder unit SADD calculates the power supply current value ISUM for each instruction cycle of the processor CPU. Thus, the external debugging apparatus EXDBG may recognize a summation of the power supply current values PSC of the designated circuit blocks CBLK for each instruction cycle of the processor CPU.

The external debugging apparatus EXDBG is coupled, for example, to the external terminal EXT used for debugging of the semiconductor integrated circuit LSI via the debugging interface DBGIF including a debugging cable or a connector attached to a board of the user system USYS. Note that, in FIG. 2, the external debugging apparatus EXDBG and the semiconductor integrated circuit LSI are coupled to each other via the bidirectional debugging interface DBGIF. However, a unidirectional debugging interface from the trace buffer TBUF and a bidirectional debugging interface coupled to the execution control unit EXECNT and selection register SELREG may be formed independently.

The external debugging apparatus EXDBG includes a trace memory TRCMEM and a debug control unit DBGCNT. The trace memory TRCMEM sequentially holds the power supply current value ISUM and execution history information CPUTRC supplied from the trace buffer TBUF, as the trace information TRCINF, The debug control unit DBGCNT, according to the debug program DBGPRG executed by the host computer HOST, controls the operation of the debugging circuit DBGC and outputs the trace information TRCINF stored in the trace memory TRCMEM to the host computer HOST.

By executing the debug program DBGPRG, the host computer HOST controls the external debugging apparatus EXDBG according to an instruction input from the input device IN and operates the debugging circuit DBGC, for example. Moreover, the host computer HOST reads the trace information TRCINF stored in the trace memory TRCMEM, and outputs it to the output device OUT, such as a display or a printer.

For example, the debugging circuit DBGC is enabled under control from the external debugging apparatus EXDBG via the debugging interface DBGIF during development of the user system USYS. When the user system USYS operates as a product, the debugging interface DBGIF is in an open state and is pulled down, for example, on the semiconductor integrated circuit LSI. As a result, the debugging circuit DBGC is disabled and its operation is prohibited. When the debugging circuit DBGC is disabled, the current measurement units MEAS1-n stop the function to measure the power supply current value PSC, but the main power supply voltage MPS is supplied to the circuit block CBLK1-n as the power supply voltage PS1-n via the current measurement units MEAS1-n.

Figure 3:
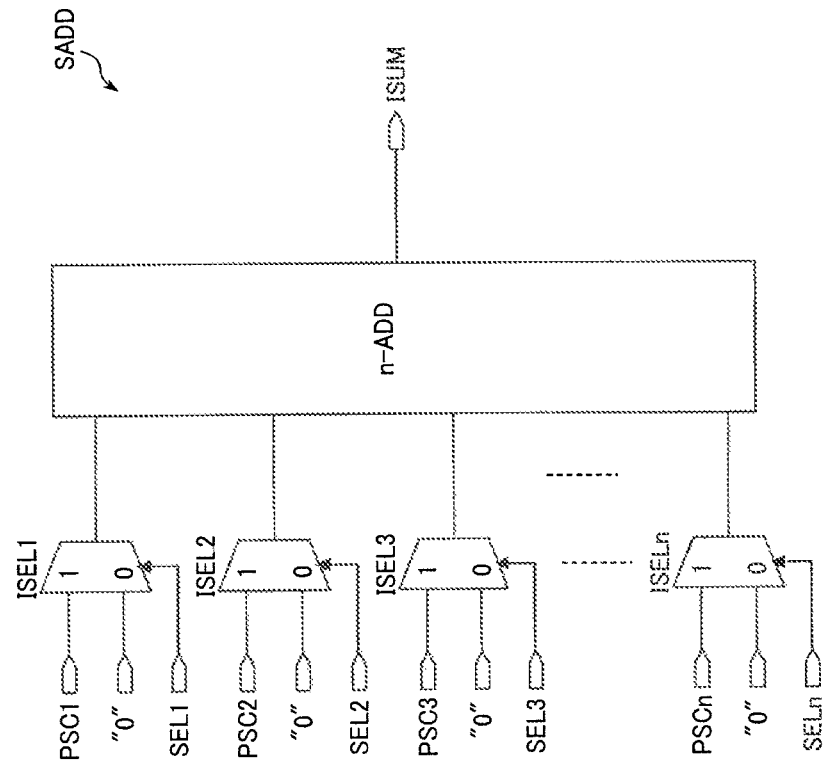
FIG. 3 illustrates an example of a selective adder unit illustrated in FIG. 2.

FIG. 3 illustrates an example of the selective adder unit SADD illustrated in FIG. 2. The selective adder unit SADD includes selectors ISEL (ISEL1, ISEL2, ISEL3, . . . , ISELn) operating in response to the selection information SEL1-n, and an adder n-ADD. Each selector ISEL, when the corresponding selection information SEL is asserted to logic "1", selects the corresponding power supply current value PSC, while when the corresponding selection information SEL is negated to logic "0", each selector ISEL selects a value indicative of "0" and outputs the selected value to the adder n-ADD. The adder n-ADD adds the values output from all the selectors ISEL1-n, and outputs the addition result as the power supply current value ISUM.

For example, when two pieces of selection information SEL are logic "1", the adder n-ADD adds the power supply current values PSC measured by two current measurement units MEAS. When five pieces of selection information SEL are logic "1", the adder n-ADD adds the power supply current values PSC measured by five current measurement units MEAS. When one piece of selection information SEL is logic "1", the adder n-ADD adds the power supply current value PSC measured by one current measurement unit MEAS. In this manner, a total of the power supply currents of an arbitrary number of circuit blocks CBLIK may be output as the power supply current value ISUM.

In debugging the user system USYS by use of the debugging system DBGSYS illustrated in FIG. 2, a total of the power supply currents flowing into an arbitrary number of circuit blocks CBLK May be traced for each instruction cycle of the processor CPU by use of the selective adder unit SADD. Thus, the power supply current values PSC of a plurality of circuit blocks CBLK may be output to the external debugging apparatus EXDBG as the trace information TRCINF of a minimum number of bits. By reducing the number of bits for outputting the trace information TRCINF, the number of external terminals used for debugging formed in the semiconductor integrated circuit LSI may be reduced and the chip size of the semiconductor integrated circuit LSI may be reduced, as with the above-described embodiment.

In debugging the user system USYS, when paying attention to the power supply current during execution of a user program by the processor CPU, the processor CPU and the memory having the user program stored therein are selected as a trace target of the power supply current, and a summation of power supply currents is traced. When paying attention to the power supply current during image processing, the image processing macro and the memory for image data are selected as the trace target of the power supply current and a summation of power supply currents is traced. When paying attention to the power supply currents of all the circuit blocks CBLKI-n, all the circuit blocks CBLICI n are selected as the trace target and a summation of the power supply currents is traced. Thus, in the semiconductor integrated circuit LSI, a summation of power supply current values except that of the debugging circuit DBGC may be easily traced.

Note that, when the power supply current value PSC is expressed in 10 bits, 80 bits are usually needed in order to trace the power supply current values PSC of eight circuit blocks CBLK. In contrast, in this embodiment, even if carries (of 7 bits for eight power supply current values PSC) at the time of summation in the adder n-ADD is taken into consideration, the summation of the power supply current values PSC may be expressed in 17 bits. That is, the number of bits required for tracing the power supply current values PSC may be compressed by 21.3% from 80 bits.

As described above, also in this embodiment, the same effect as that of the above-described embodiment may be obtained. Furthermore, the power supply current values PSC of a plurality of circuit blocks CBLIK may be traced as the power supply current value ISUM. Thus, for example, also when the power supply current values PSC of eight circuit blocks CBLK are simultaneously traced, the number of bits of the trace information TRCINF may be minimized. In other words, the power supply current values PSC of eight circuit blocks CBLIK may be traced for each instruction cycle of the processor CPU, and the efficiency in debugging may be improved.

Figure 4:
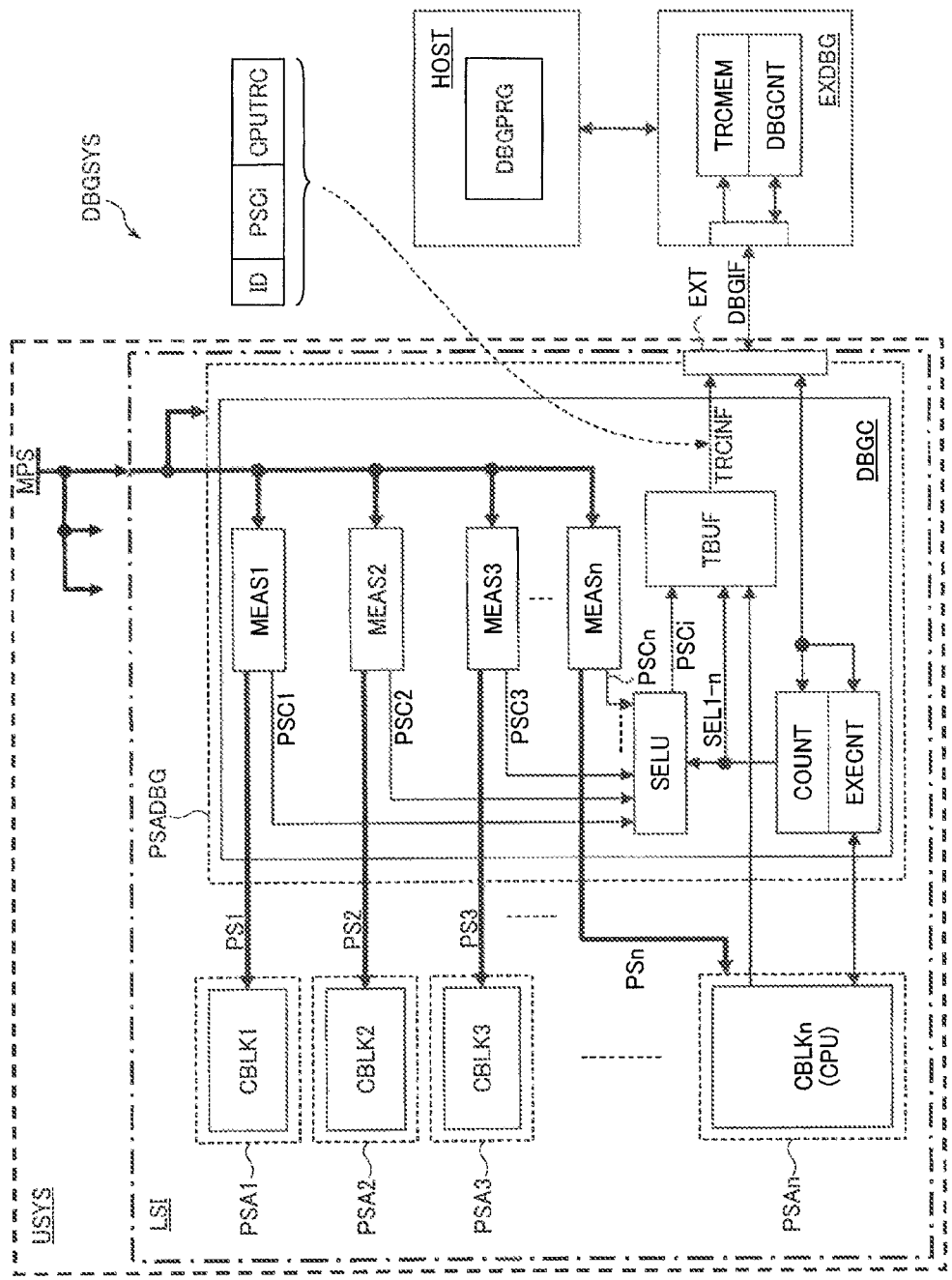
FIG. 4 illustrates an example of a debugging system in an alternative embodiment.

FIG. 4 illustrates an example of the debugging system DBGSYS in an alternative embodiment. For the same elements as those in the embodiments described above, the same reference symbols are given, and the detailed description thereof is omitted. In this embodiment, the selection unit SELU and a counter COUNT are formed in place of the selective adder unit SADD and selection register SELREG of the debugging circuit DBGC illustrated in FIG. 2. The other configuration of the debugging system DBGSYS is the same as that of FIG. 2 except that the trace information TRCINF held in the trace buffer TBUF differs.

The selection unit SELU selects any one of the power supply current values PSC1-n according to the selection information SEL1-n generated by the counter COUNT, and outputs the selected power supply current value PSC to the trace buffer TBUF as a power supply current value PSCi. For example, the selection unit SELU, when the selection information SEL1 is output from the counter COUNT, selects the power supply current value PSC1, while when the selection information SELn is output from the counter COUNT, the selection unit SELU selects the power supply current value PSCn.

For example, the counter COUNT is a resettable counter and sequentially counts up the value indicative of the circuit block CBLK1-n from "0". Then, the counter COUNT is cleared to "0" after the count value reaches "n", and then sequentially counts up again. The count value of the counter COUNT is reset to "0" in response to control information (an initialization request) from the external debugging apparatus EXDBG. Alternatively, the count value of the counter COUNT is automatically reset to 0 within the counter COUNT, using a maximum count value (=n) set in a setting register included in the debugging circuit DBGC.

The counter COUNT performs the count operation for each instruction cycle of the processor CPU, and cyclically generates the selection information SEL1-n. For example, for each count operation, one piece of selection information SEL1-n to be asserted is shifted in turn and the remaining n−1 pieces of selection information SEL are negated. Thus, the selection unit SELU cyclically selects the power supply current values PSC1-n for each instruction cycle of the processor CPU. "n" instruction cycles are performed to complete one cycle of power supply current values PSC1-n to be selected.

The trace buffer TBUF is the same as the trace buffer TBUF illustrated in FIG. 2 except that the former holds identification information ID indicative of the circuit block CBLK corresponding to the power supply current value PSCi and the selected power supply current value PSCi in place of the power supply current value ISUM. The trace buffer TBUF holds the selection information SEL (e.g., the numerical value of "1" to "n") for selecting the power supply current value PSC, as the identification information ID. The trace buffer TBUF sequentially outputs the held identification information ID, power supply current value PSCi, and execution history information CPUTRC to the external debugging apparatus EXDBG via the debugging interface DBGIF as the trace information TRCINF, For example, when the user system USYS includes eight circuit blocks CBLK, the identification information ID has three bits. For this reason, when the power supply current value PSC is expressed in 10 bits, the identification information ID and the power supply current value PSCi are expressed in 13 bits. Also when the user system USYS includes 32 circuit blocks CBLK, the identification information ID may have 5 bits. For this reason, also when the number of the circuit blocks CBLK is large, it is possible to prevent the number of bits of trace information TRCINF from significantly increasing and is also possible to minimize the number of external terminals of the semiconductor integrated circuit LSI required for debugging.

Figure 5:
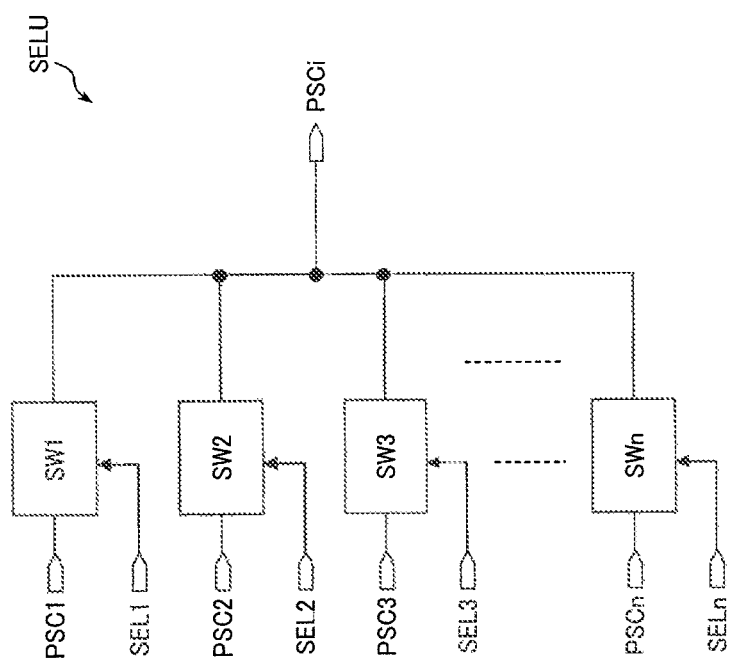
FIG. 5 illustrates an example of a selection unit illustrated in FIG. 4.

FIG. 5 illustrates an example of the selection unit SELU illustrated in FIG. 4. The selection unit SELU includes switches SW (SW1, SW2, SW3, . . . , SWn) corresponding to the respective circuit blocks CBLIK1-n. Each switch SW is turned on when the corresponding selection information SEL (any one of SEL1-n) is asserted, and outputs the receiving power supply current value PSC (any one of PSC1-n) as the power supply current value PSCi. In this embodiment, when the debugging circuit DBGC operates, one of the selection information SEL1-n is cyclically asserted. For this reason, one of the power supply current values PSC1-n is cyclically output as the power supply current value PSCi. Therefore, n instruction cycles are performed, so that all the power supply current values PSC1-n may be traced, Note that one of the power supply current values PSC1-n may be cyclically traced for every plurality of instruction cycles.

Note that, in this embodiment, the number of bits of the identification information ID required for eight circuit blocks CBLIK is three. For this reason, when the power supply current value PSC is expressed in 10 bits, the power supply current value PSC may be traced using 13 bits. This is 16.3% of 80 bits which are required when all the power supply current values PSC of eight circuit blocks CBLIK are traced.

As described above, also in this embodiment, the same effect as that of the above-described embodiments may be obtained. In particular, when the power supply current of the circuit block CBLIK1-n varies very little in the unit of instruction cycle of the processor CPU, the power supply current value PSC1-n of the circuit block CBLIK1-n may be traced accurately.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention, Although the embodiments of the present invention have been described in detail, it should be understood that the various changes, substitutions, and alterations could be made hereto without departing from the spirit and scope of the invention.

What is claimed is:

1. A semiconductor device, comprising:
   a current measurement unit configured to measure a power supply current consumed in each of a plurality of circuit blocks and to output a plurality of measurement results corresponding to the plurality of circuit blocks;
   a selection unit configured to select one of the plurality of measurement results according to selection information; and
   a buffer configured to receive and store the selected measurement result.

2. The device of claim 1, wherein the buffer is configured to store execution history information associated with the selected measurement result.

3. The device of claim 1, further comprising a counter configured to generate the selection information.

4. The device of claim 1, further comprising a selection register configured to store the selection information.

5. The device of claim 4, wherein the selection unit is configured to select the measurement result based on the selection information stored in the selection register.

6. The device of claim 4, wherein the selection register is configured to receive selection information from an external debugging apparatus.

7. The device of claim 1, further comprising an additional current measurement unit configured to measure a power supply current of an additional circuit block and to output an additional measurement result.

8. The device of claim 7, wherein the buffer is further configured to sequentially output the selected measurement result and the additional measurement result.

9. The device of claim 7, wherein the selection unit is configured to add the measurement result and the additional measurement result based on selection information.

10. The device of claim 9, wherein the buffer is further configured to store the additional measurement result.

11. A method, comprising:
    measuring a power supply current consumed by each of a plurality of circuit blocks and to output a plurality of measurement results corresponding to the plurality of circuit blocks;
    selecting one of the plurality of measurement results according to selection information; and
    storing the selected measurement result in a buffer.

12. The method of claim 11, further comprising:
    storing execution history associated with the selected measurement result in the buffer.

13. The method of claim 11, further comprising generating the selection information using a counter.

14. The method of claim 11, further comprising storing the selection information in a selection register.

15. The method of claim 14, selecting the measurement result comprises selecting the measurement result based on the selection information stored in the selection register.

16. The method of claim 14, receiving the selection information from an external debugging apparatus.

17. The method of claim 11, further comprising:
    measuring a power supply current of an additional circuit block and outputting an additional measurement result.

18. The method of claim 17, further comprising outputting the selected measurement result and the additional measurement result from the buffer.

19. The method of claim 17, further comprising adding the measurement result and the additional measurement result based on selection information.

20. The method of claim 19, further comprising storing the additional measurement result in the buffer.

21. A semiconductor device, comprising:
    a current measurement unit configured to measure a power supply current consumed in a circuit block and to output a measurement result;
    a selection unit configured to select the measurement result according to selection information;
    a buffer configured to receive and store the selected measurement result; and
    an additional current measurement unit configured to measure a power supply current of an additional circuit block and to output an additional measurement result.

* * * * *